United States Patent
Yeung et al.

(10) Patent No.: US 9,501,400 B2
(45) Date of Patent: Nov. 22, 2016

(54) IDENTIFICATION AND OPERATION OF SUB-PRIME BLOCKS IN NONVOLATILE MEMORY

(71) Applicant: SanDisk Technologies Inc., Plano, TX (US)

(72) Inventors: Chun Sum Yeung, Milpitas, CA (US); Jian Chen, Menlo Park, CA (US); Aaron Lee, Mountain View, CA (US); Abhijeet Manohar, Bangalore (IN); Chris Avila, Saratoga, CA (US); Dana Lee, Saratoga, CA (US); Jianmin Huang, San Carlos, CA (US)

(73) Assignee: SanDisk Technologies LLC, Plano, TX (US)

(*) Notice: Subject to any disclaimer, the term of this patent is extended or adjusted under 35 U.S.C. 154(b) by 431 days.

(21) Appl. No.: 14/079,460

(22) Filed: Nov. 13, 2013

(65) Prior Publication Data

US 2015/0134885 A1 May 14, 2015

(51) Int. Cl.
*G06F 12/02* (2006.01)
*G11C 29/00* (2006.01)
*G11C 16/34* (2006.01)

(52) U.S. Cl.
CPC ......... *G06F 12/0246* (2013.01); *G11C 16/349* (2013.01); *G11C 29/82* (2013.01); *G11C 29/88* (2013.01); *G06F 2212/1036* (2013.01); *G06F 2212/7205* (2013.01); *G06F 2212/7208* (2013.01); *G06F 2212/7211* (2013.01)

(58) Field of Classification Search
CPC .............. G06F 12/0246; G06F 2212/7205; G06F 2212/1036; G06F 2212/7206; G06F 2212/7208; G06F 2212/7211; G06F 11/0751; G06F 11/3452; G11C 16/349; G11C 29/82; G11C 29/88

See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,595,924 A | 1/1997 | Yuan et al. |
| 5,661,053 A | 8/1997 | Yuan |
| 5,768,192 A | 6/1998 | Eitan |
| 5,903,495 A | 5/1999 | Takeuchi et al. |
| 6,011,725 A | 1/2000 | Eitan |
| 6,046,935 A | 4/2000 | Takeuchi et al. |
| 6,222,762 B1 | 4/2001 | Guterman et al. |
| 7,057,939 B2 | 6/2006 | Li et al. |
| 7,433,993 B2 | 10/2008 | Sinclair |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Hashem Farrokh
(74) *Attorney, Agent, or Firm* — Davis Wright Tremaine LLP

(57) ABSTRACT

In a block-erasable nonvolatile memory array, blocks are categorized as bad blocks, prime blocks, and sub-prime blocks. Sub-prime blocks are identified from their proximity to bad blocks or from testing. Sub-prime blocks are configured for limited operation (e.g. only storing non-critical data, or data copied elsewhere, or using some additional or enhanced redundancy scheme).

18 Claims, 14 Drawing Sheets

(56) References Cited

U.S. PATENT DOCUMENTS

| | | | |
|---|---|---|---|
| 7,616,499 B2 | 11/2009 | Wan et al. | |
| 8,214,700 B2 | 7/2012 | Chen | |
| 8,504,798 B2 | 8/2013 | Conley et al. | |
| 2005/0251617 A1* | 11/2005 | Sinclair | G06F 3/061 |
| | | | 711/103 |
| 2009/0089482 A1* | 4/2009 | Traister | G06F 12/0246 |
| | | | 711/103 |
| 2010/0161880 A1† | 6/2010 | You | |
| 2010/0229068 A1* | 9/2010 | Yang | G06F 11/1068 |
| | | | 714/752 |
| 2011/0096601 A1 | 4/2011 | Gavens et al. | |
| 2011/0099460 A1 | 4/2011 | Dusija et al. | |
| 2011/0296122 A1* | 12/2011 | Wu | G06F 12/0804 |
| | | | 711/156 |
| 2012/0060054 A1* | 3/2012 | Sun | G06F 12/0246 |
| | | | 714/6.13 |
| 2012/0220088 A1 | 8/2012 | Alsmeier | |
| 2013/0028021 A1 | 1/2013 | Sharon et al. | |
| 2013/0031429 A1 | 1/2013 | Sharon et al. | |
| 2013/0031430 A1 | 1/2013 | Sharon | |
| 2013/0031431 A1 | 1/2013 | Sharon et al. | |
| 2013/0107628 A1 | 5/2013 | Dong et al. | |
| 2013/0114342 A1 | 5/2013 | Sakai et al. | |
| 2013/0124787 A1* | 5/2013 | Schuette | G06F 12/0246 |
| | | | 711/103 |
| 2013/0332796 A1* | 12/2013 | Ellis | G06F 11/1048 |
| | | | 714/763 |

OTHER PUBLICATIONS

U.S. Appl. No. 13/741,252 entitled "Dynamic Block Linking with Individually Configured Plane Parameters," filed Jan. 4, 2013, 25 pages.

\* cited by examiner
† cited by third party

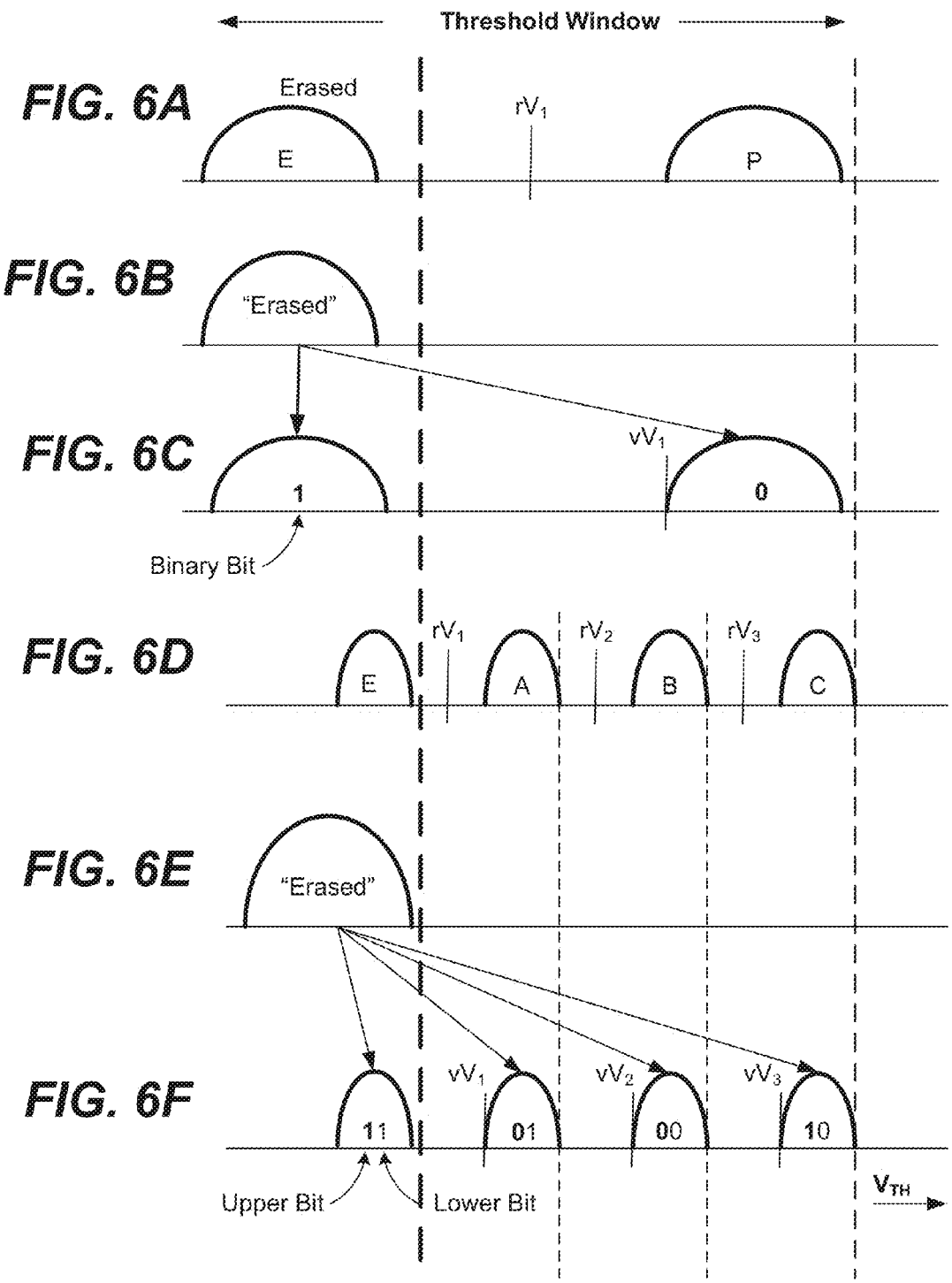

Multistate Memory

Lower Page Programming (2-bit Code)

Upper Page Programming (2-bit Code)

Lower Page Read (2-bit Code)

Upper Page Read (2-bit Code)

IDENTIFICATION AND OPERATION OF SUB-PRIME BLOCKS IN NONVOLATILE MEMORY

BACKGROUND

This application relates to the operation of re-programmable non-volatile block-erasable memory such as semiconductor flash memory, and more specifically, to operating such memories in an efficient manner.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. Flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

SUMMARY OF THE INVENTION

In a block-erasable nonvolatile memory array, blocks may be categorized as bad blocks if they fail some testing. Blocks that pass testing may be further categorized, for example as prime and sub-prime blocks. This categorization may be based on the same test results as bad block identification, or may be based on separate testing including testing based on write performance (e.g. Erratic Program Detection, or "EPD"). Sub-prime blocks may be identified from their proximity to bad blocks.

Identification of sub-prime blocks, or other categorization of operational blocks, allows different operation of such blocks that is appropriate to their characteristics. Sub-prime blocks may be linked to form sub-prime metablocks so that sub-prime blocks are concentrated in a relatively small number of metablocks. Different operation of sub-prime blocks may include prohibiting sub-prime blocks from storing critical data, operating in only SLC or only MLC mode, storing only data that is stored elsewhere in the memory, storing only data with special redundancy, and applying a wear-leveling scheme that treats sub-prime and prime blocks differently.

An example of a method of operating blocks of a memory array includes: categorizing the blocks into a plurality of categories including prime blocks, sub-prime blocks, and bad blocks; subsequently selecting individual blocks in different planes for parallel operation in metablocks such that each block in a metablock is selected from the same category; configuring metablocks formed from prime blocks as prime metablocks that are operated in a first manner; and configuring metablocks formed from sub-prime blocks as sub-prime metablocks that are operated in a second manner that is different from the first manner.

The categorizing may include identifying a bad block from test results obtained from the bad block, and subsequently identifying sub-prime blocks based on their proximity to the bad block. The categorizing may include: testing each of the blocks to obtain test results; subsequently, comparing test results for a block with first criteria to determine if the block is a bad block; and comparing the test results for the block with second criteria to determine if the block is a sub-prime block. Blocks that are not determined to be bad blocks, and are not determined to be sub-prime blocks, may be classified as good blocks. The categorizing may include identifying bad blocks from testing, and identifying sub-prime blocks from proximity to bad blocks and from testing of sub-prime blocks. The metablocks formed from sub-prime blocks may be limited to operation as MLC blocks and the metablocks formed from prime blocks may be configured for operation as either SLC or MLC blocks. The metablocks formed from sub-prime blocks may be limited to store certain types of data and the metablocks formed from prime blocks may be used to store any data sent to the memory array. Operation in the second manner may include assigning a write-erase cycle count to a sub-prime block that is greater than a number of write-erase cycles actually undergone by the sub-prime block.

An example of a method of operating erase blocks of a memory array includes: individually testing a plurality of erase blocks to determine a number of memory cells with threshold voltages that are between target threshold voltage ranges associated with logic states for each of the plurality of erase blocks; categorizing the plurality of erase blocks into a plurality of categories based on the number, the plurality of categories including prime erase blocks, and sub-prime erase blocks; operating prime erase blocks in a first manner; and operating sub-prime erase blocks in a second manner that is different from the first manner.

The first manner may include operation in both MLC and SLC modes, and the second manner may restrict sub-prime erase blocks to use in SLC mode. Operation in the second manner may be restricted to blocks used for internal copying of data. Operation in the second manner may be restricted to storing only data that is recoverable from other blocks in the memory array. The data may be recoverable from another copy of the data that is stored in another block in the memory array. The data may be recoverable by performing an exclusive OR operation (XOR) on data stored in another block in the memory array.

An example of a method of operating erase blocks of a memory array includes: individually testing a plurality of erase blocks to obtain block-specific test information; storing the block-specific test information; subsequently, categorizing the plurality of erase blocks into a plurality of categories based on the block-specific test information, the plurality of categories including prime erase blocks, and sub-prime erase blocks; configuring prime erase blocks for general use in storing user data; and configuring sub-prime erase blocks for limited use.

The testing may include determining a number of memory cells with threshold voltages that are between target threshold voltage ranges associated with logic states for each of the plurality of erase blocks. Erase blocks that are in close proximity to bad blocks may be identified and classified as sub-prime blocks. Prime metablocks may be configurable as either Single Level Cell (SLC) blocks or Multi Level Cell (MLC) blocks, and sub-prime erase blocks may be configured exclusively as SLC blocks. Prime metablocks may be configurable as either Single Level Cell (SLC) blocks or Multi Level Cell (MLC) blocks, and sub-prime erase blocks may be configured exclusively as SLC blocks. The sub-prime erase blocks may be configured for use that is limited to storing data that is already stored in another block in the memory array, or can be reproduced from data stored in another block in the memory array.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6F illustrate examples of programming memory cells.

DETAILED DESCRIPTION

Memory System

Figure 1:
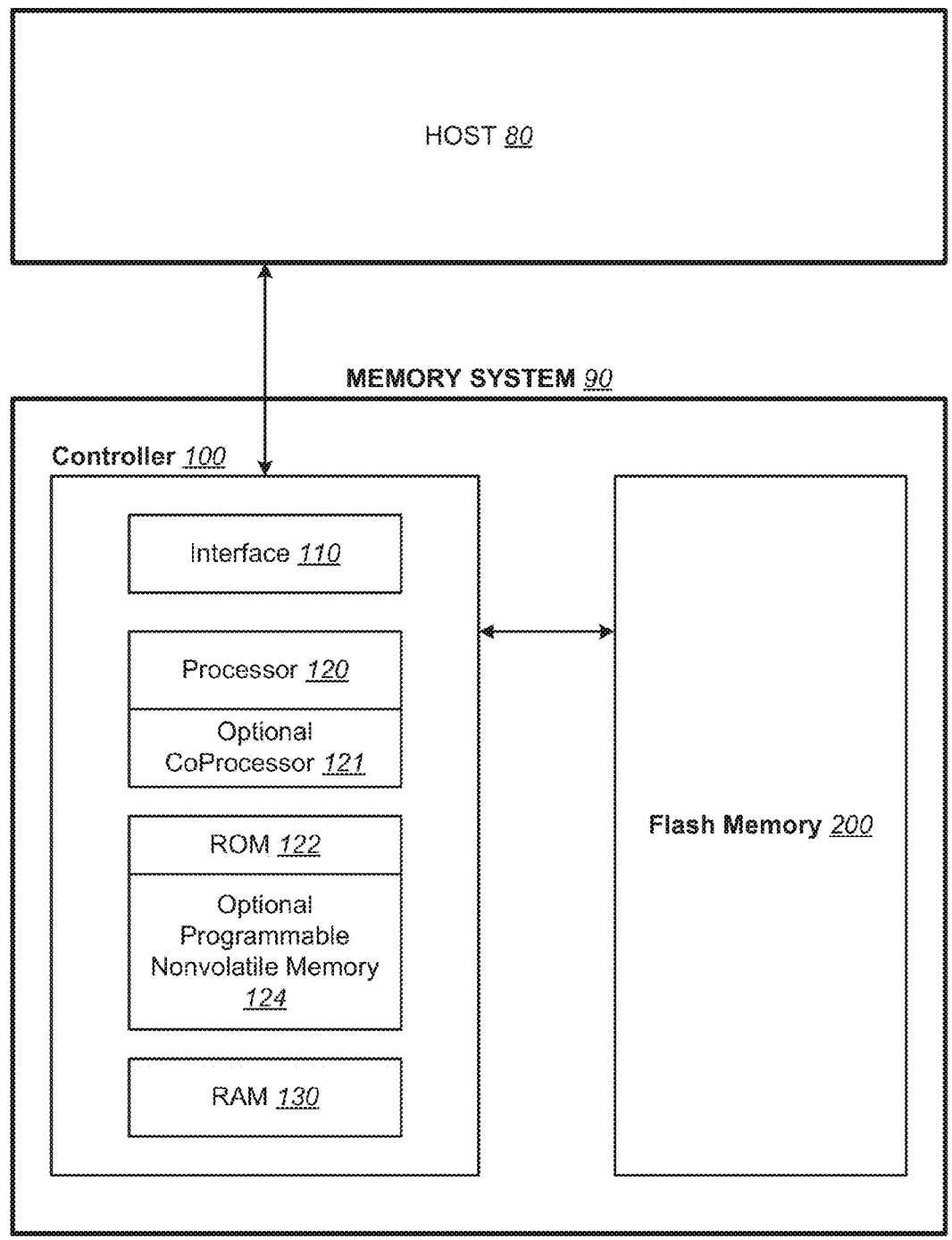
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits, a processor, ROM (read-only-memory), RAM (random access memory), programmable nonvolatile memory, and additional components. The controller is typically formed as an ASIC (application specific integrated circuit) and the components included in such an ASIC generally depend on the particular application.

Physical Memory Structure

Figure 2:
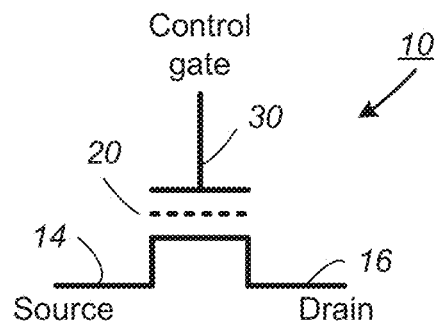
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
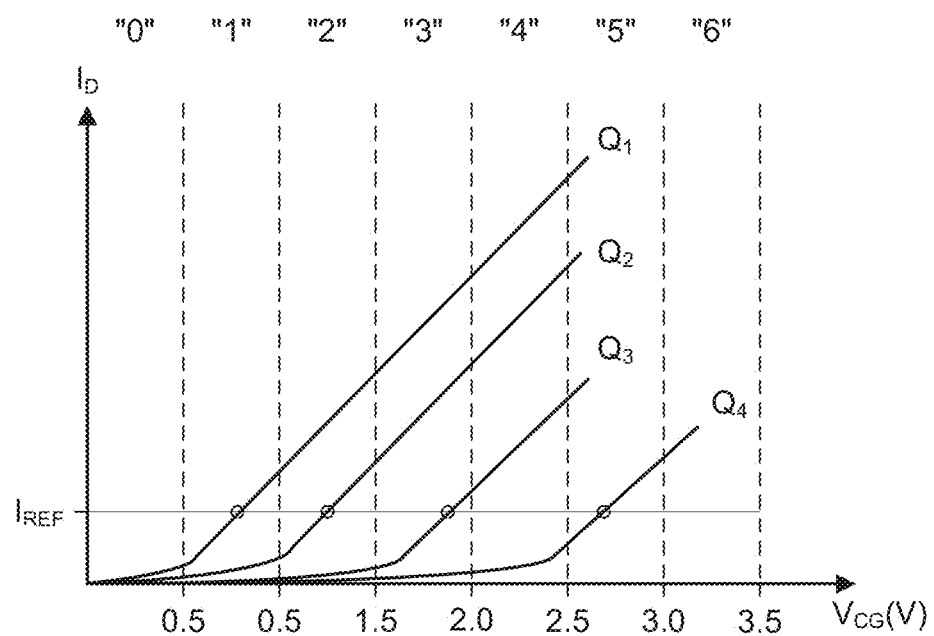
FIG. 3 illustrates the source-drain current $I_D$ and the control gate voltage $V_{CG}$.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", respectively and one erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
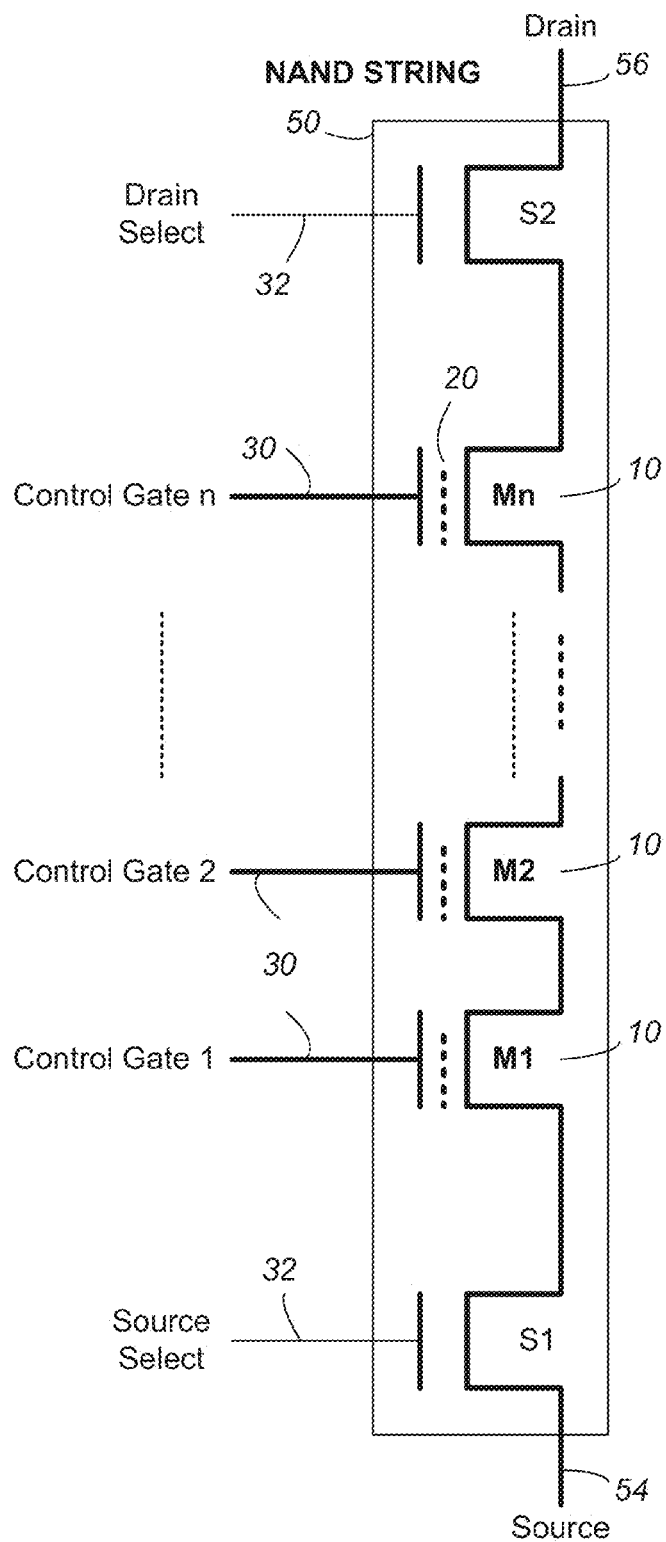
FIG. 4A illustrates schematically a string of memory cells organized into a NAND string.

FIG. 4A illustrates schematically a string of memory cells organized into a NAND string. A NAND string 50 comprises of a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
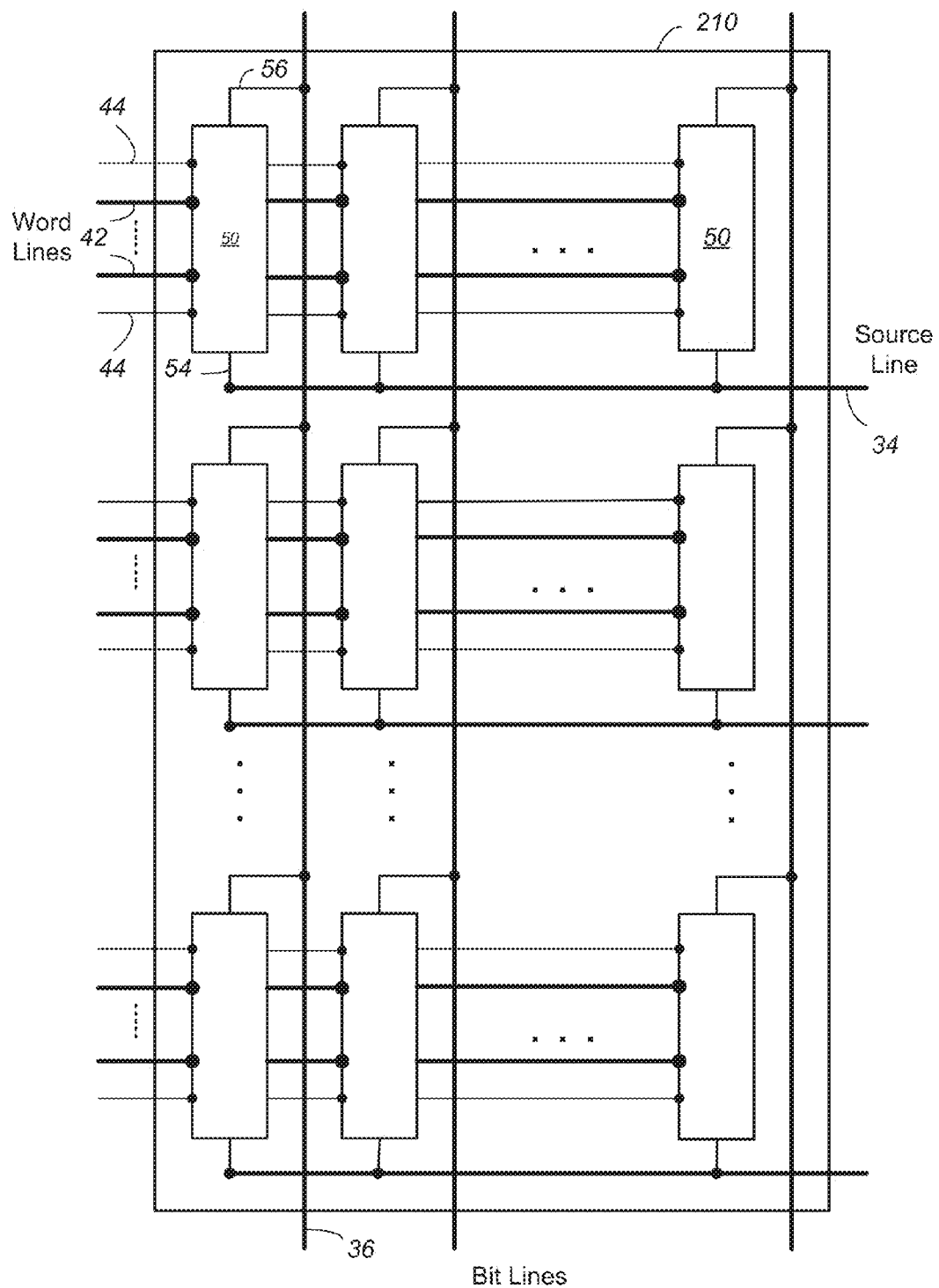
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
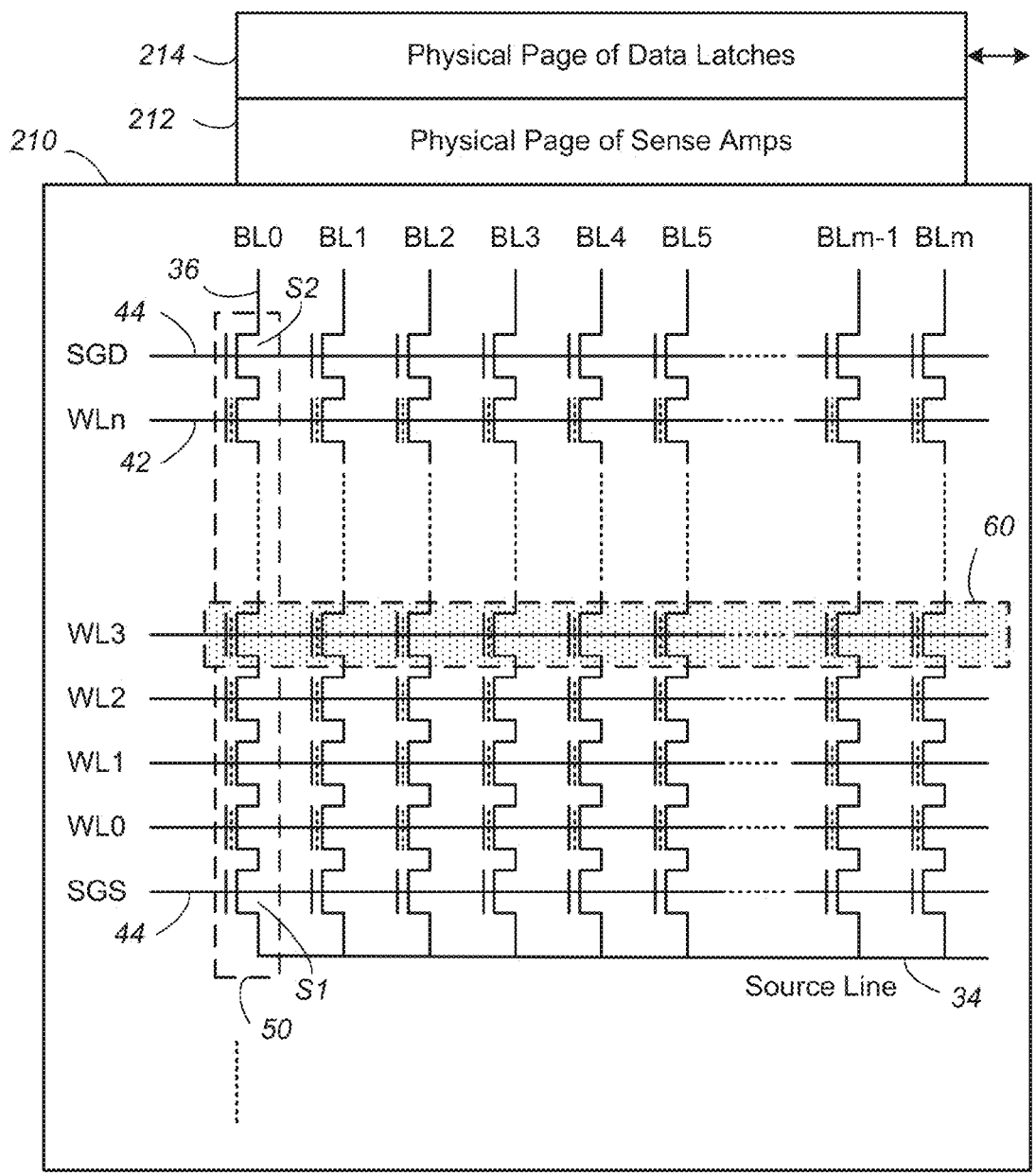
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A, A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing data and must be written to a previously unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

In addition to planar (two dimensional) memory arrays as described above, three dimensional memory arrays are formed with multiple layers of memory cells stacked above each other on a substrate. Examples of such three dimensional memory arrays, their formation, and their operation are described in U.S. Patent Publication Number 2012/0220088 and in U.S. Patent Publication Number 2013/0107628, which are hereby incorporated by reference in their entirety.

SLC and MLC Programming

FIG. 6A-6C illustrate an example of a population of 2-state memory cells (Single Level Cells, or "SLC" cells). FIG. 6A illustrates how the population of memory cells are programmable into two distinct distributions of threshold voltages, an erased state, "E" and a programmed state, "P." Memory cells may be read by determining whether their threshold voltages are above or below a read voltage, $rV_1$. FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into a zone demarcated by verify level $vV_1$. In this way, each memory cell can be programmed to the programmed state or remain un-programmed in the "erased" state. Binary bits, or logic states, are associated with each distribution. In the example shown, the erased distribution is associated with a logic state "1" and the programmed distribution is associated with a logic state "0."

FIG. 6D-6F illustrate an example of programming a population of 4-state memory cells (MLC cells). It will be understood that memory cells may be configurable as either 2-state or 4 state cells so that the same memory cells may be SLC at one time and MLC at another time. Typically memory cells are configured as SLC or MLC on a block by block basis so that all cells of a block are operated together as either an SLC block or an MLC block at any given time. FIG. 6D illustrates the population of memory cells programmable into four distinct distributions of threshold voltages respectively representing memory states "E", "A", "B" and "C". FIG. 6E illustrates the initial distribution of "erased" threshold voltages for an erased memory. FIG. 6F illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the erased state. As the memory gets more programming, the initial distribution of the erased state as shown in FIG. 6E will become narrower.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

While the examples above illustrate 2-state SLC operation and 4-state MLC operation, it will be understood that MLC operation is not limited to 4-state examples. For example, eight threshold voltage distributions may be used to store three bits per cell. Other numbers of threshold voltage distributions may be used to store other numbers of bits per cell.

Upper and Lower Page Programming and Reading

Figure 7A:
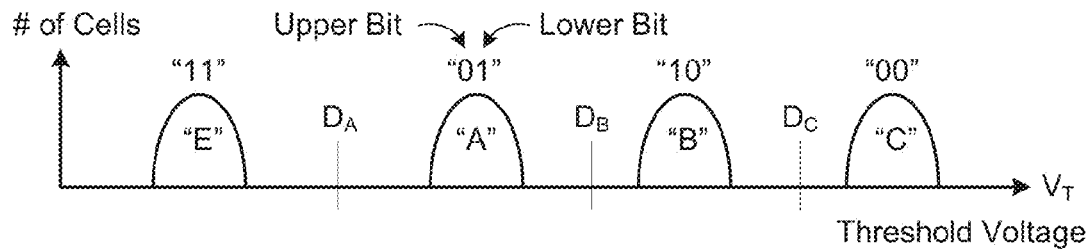
FIGS. 7A-7F illustrate examples of programming and reading of a 4-state memory.

FIGS. 7A-7E illustrate the programming and reading of the 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. Pat. No. 7,057,939.

Figure 7B:
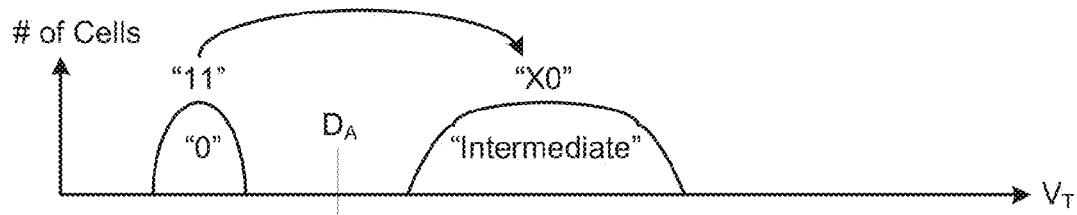

FIG. 7B illustrates the lower page programming (lower bit) in a 2-pass programming scheme using the 2-bit code. The fault-tolerant code shown essentially avoids any upper page programming to transit through any intermediate states. Thus, the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than $D_C$.

Figure 7C:
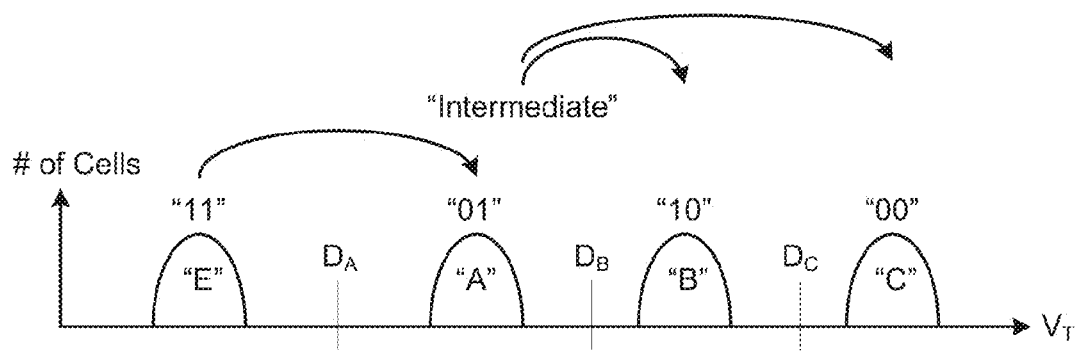

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "C". Similarly, if the upper page is to remain at "1", while the lower page has been programmed to "0", it will require a transition from the "intermediate" state to (1, 0) as represented by programming the "intermediate" state to "B".

Figure 7D:
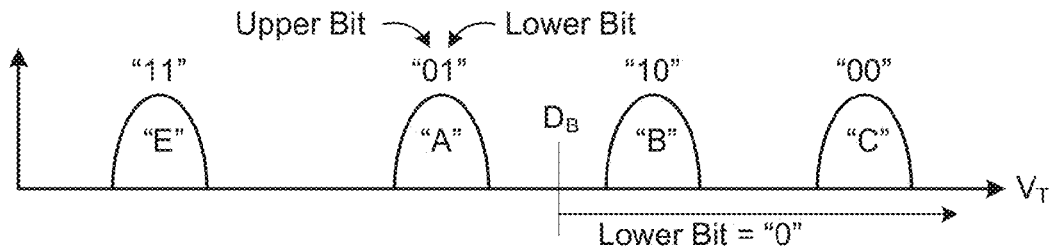

FIG. 7D illustrates the read operation that is required to discern the lower bit of the 4-state memory encoded with the 2-bit code. If the upper page has been programmed and then a readB operation will yield the lower page data correctly. On the other hand, if the upper page has not yet been programmed, the lower page data should be read by a readA operation.

Figure 7E:
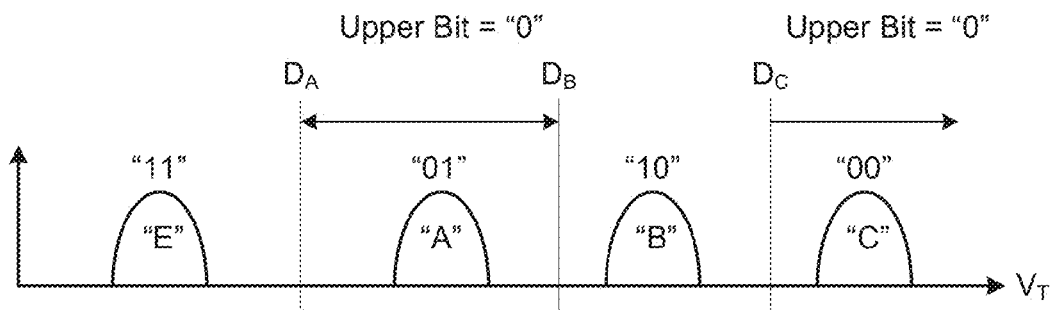

FIG. 7E illustrates the read operation that is required to discern the upper bit of the 4-state memory encoded with the 2-bit code. As is clear from the figure, the upper page read will require a 3-pass read of readA, readB and readC, respectively relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit. In other examples, additional pages of data may be stored by storing more than two bits per cell in a physical page. For example, in a 3-bit per cell memory, a physical page of memory cells will store three logical pages.

Erratic Program Detection

In some memory programming operations, some memory cells may be over-programmed or under-programmed so that they are not within the threshold voltage range associated with the data being stored. Over-programming and under-programming may indicate various conditions in a memory array including a defective word line, short (low resistance) between word lines or other components, or other physical defect. In some memory systems, memory cells that have threshold voltages between assigned threshold voltage ranges (e.g. between distributions E, A, B, and C) are detected and are counted to give an indication of whether program operations are satisfactory or erratic. Examples of such Erratic Program Detection ("EPD") are described in U.S. Patent Application No. 2013/0114342, which is hereby incorporated by reference in its entirety.

Figure 7F:
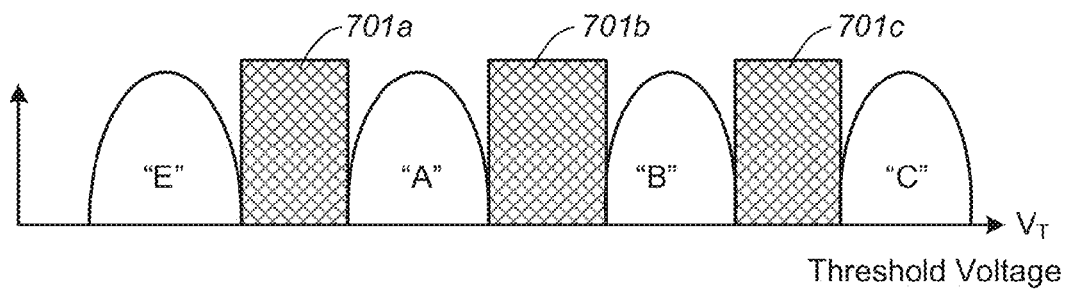

FIG. 7F illustrates forbidden zones 701a-c between threshold voltage ranges E, A, B, and C. Memory cells may have threshold voltages in such forbidden zones because of over-programming or under-programming. For example, a memory cell may have a threshold voltage in the forbidden zone 701c between B and C ranges because of over-programming when the memory cell was being programmed to the B range, or because of under-programming when being programmed to the C range.

In some cases, EPD information may be used to indicate a defective word line, bad block or other defective unit. The number of memory cells in a forbidden zone, or zones, may be compared with a threshold and if the number exceeds the threshold then the unit may be considered defective and may be discarded (e.g. such a block may be considered a bad block and may be added to a bad block list so that it is not subsequently used for storage of data).

According to an aspect of the present invention, memory cells may be subjected to EPD testing in order to identify not only defective components (such as bad blocks) but also to identify certain components that may operate in a manner that is acceptable, but is below a desirable level. Such "sub-prime" components may continue to be used, but their use may be restricted, or modified, compared with components that operate at a desirable level. For example, data stored in sub-prime blocks may have more errors (bad bits) than prime blocks but may still be within acceptable limits (i.e. generally correctable by ECC). Sub-prime blocks may wear faster so that they become unreliable sooner than prime blocks under the same conditions.

EPD testing may be performed as part of factory testing, for example as part of testing a memory system such as a memory card, USB drive, or Solid State Drive (SSD). Alternatively, EPD testing may be performed as part of an initialization routine or later. EPD testing may be used for multiple purposes. For example, EPD testing may identify bad blocks, which are then discarded, and also identify sub-prime blocks, which are subsequently used in a limited or modified manner.

In one example, an EPD testing procedure performs multiple programming and erasing operations on memory cells to identify numbers of cells in forbidden zones. If the number of such cells in a given block exceeds a first threshold then the block may be considered a bad block and may be discarded. If the block is not bad, then the number of such cells may be compared with a second threshold. If the number exceeds the threshold then the block may be considered to be a sub-prime block. Thus, blocks may be categorized into bad blocks, sub-prime blocks, and prime blocks on the basis of EPD testing. Blocks, or other units, may be categorized into additional categories also (e.g. different degrees or types of sub-prime operation).

The number of write-erase cycles and the threshold number used to identify sub-prime blocks depend on a number of factors. In some cases, write-erase cycles may continue until a predetermined number of sub-prime blocks are identified. A low threshold number may be used initially to identify a relatively large number of suspicious blocks which are then subject to further write-erase cycles (while other blocks are not cycled, thus reducing wear and testing time). The threshold number may be increased during such cycling until the number of blocks exceeding the threshold number reaches a target.

Where EPD testing is done as part of factory testing, the test results may be saved in the memory system and used when the memory is configured (e.g. after firmware is downloaded). In some cases, a simple list of sub-prime blocks may be saved. In other cases, more detailed data may be saved (e.g. EPD numbers for some or all blocks) so that the firmware can then configure blocks in an appropriate manner according to the expected use of the memory system (e.g. firmware may discard all sub-prime blocks if the memory has sufficient capacity, or may use all sub-prime blocks for all purposes if reliability is not critical, or may configure some numbers of sub-prime blocks for some limited operation depending on the requirements of the memory system). Examples of such limited operation are described later.

While the example above refers to a block-by-block determination, EPD results may also be obtained and used for other units. For example, a particular word line may have EPD results that indicate that it is a sub-prime word line while other word lines in the same block are not sub-prime. Such a word line may be configured for limited operation while other word lines in the same block are available for unlimited operation.

Additional Characteristics

While EPD may provide information regarding sub-prime operation of a block or other portion of a memory array, other characteristics, including programming characteristics, may also provide such information and may be used for categorization purposes.

Figure 8:
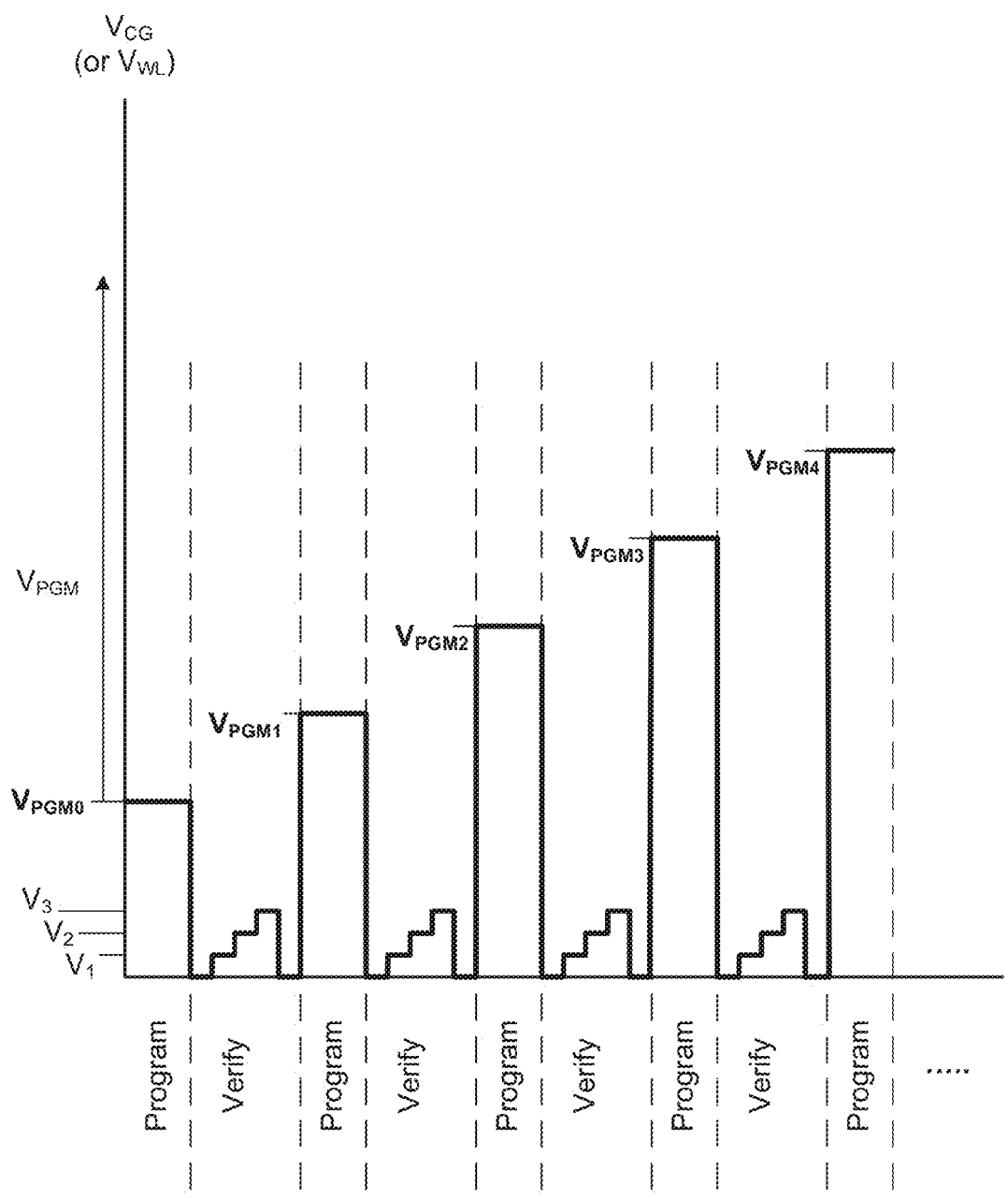
FIG. 8 illustrates a multi-step programming operation.

FIG. 8 illustrates a technique for programming an MLC memory cell to a target memory state by applying a series of programming pulses to a selected word line. In this way, a page of memory cells whose control gates are coupled to the word line can be programmed together. The programming pulse train used may have increasing period or amplitude in order to counteract the accumulating electrons programmed into the charge storage unit of the memory cell. A programming voltage $V_{PGM}$ is applied to the word line of a page under programming. The programming voltage $V_{PGM}$ is a series of programming voltage pulses in the form of a staircase waveform starting from an initial voltage level, $V_{PGM0}$, then $V_{PGM1}$, then $V_{PGM2}$, and so on. Each cell of the page under programming is subject to this series of programming voltage pulses, with an attempt at each pulse to add incremental charges to the charge storage element of the cell. In between programming pulses, the cell is read back to determine its threshold voltage. The read back process may involve one or more sensing operation. Programming stops for the cell when its threshold voltage has been verified to fall within the threshold voltage zone corresponding to the target state. Whenever a memory cell of the page has been programmed to its target state, it is program-inhibited while the other cells continue to be subject to programming until substantially all cells of the page have been program-verified. One method of program-inhibiting a memory cell is to raise its bit line voltage from 0V to VCC during programming. In this way, even when the cell's control gate has a programming voltage on it, the effective programming voltage on the floating gate is reduced by VCC, thereby inhibiting further programming of the cell.

During programming, characterization information may be recorded for later use. For example, when programming along a particular word line, the number of programming pulses needed to complete programming (loop count) may be recorded for the word line. Loop count may vary from word line to word line. In some cases the highest program voltage used may be recorded as characterization information. For example, if programming of a word line ends after a pulse of VPGM3 is applied then VPGM3 may be recorded as the highest programming voltage used. Such characterization information may be aggregated over all word lines of a block to provide an aggregate loop count, program voltage, etc.

Programming characteristics such as loop count and programming voltage may be obtained instead of, or in addition to EPD data, and may be used to identify sub-prime portions of a memory array (e.g. sub-prime blocks). In particular, a high loop count or high programming voltage may cause increased wear on memory cells. Application of more and/or larger voltage pulses may lead to faster wear-out. Therefore, units with such characteristics may be designated as sub-prime and their operation may be limited.

In addition to programming characteristics, other characteristics may also be used to categorize blocks or other units. For example, erase characteristics including erase voltage and erase loop count may be used to categorize blocks similarly to program voltage and program loop count.

Portions of a memory array, such as blocks, may be categorized according to numbers of bad bits observed in data that is read from the portions. For example, ECC may provide an indication of the number of bad bits in a portion of data. The number of bad bits may be aggregated for a block to provide an indication of risk of data damage associated with a particular block. Blocks with high risk of damage (large numbers of bad bits) may be categorized as sub-prime and may be treated accordingly.

A simple way to categorize blocks as sub-prime blocks is based on proximity to bad blocks. Bad blocks may be identified by any suitable technique and identification of bad blocks is commonly performed as part of factory testing. It has been found that blocks that are near bad blocks are more likely to fail than other blocks. For example, where a bad block is the result of some localized fabrication defect it is likely that the effects of the defect may extend beyond a single bad block. Thus, even though neighboring blocks may pass testing (may not be considered bad blocks) they may not operate reliably over the life of the product.

Figure 9:
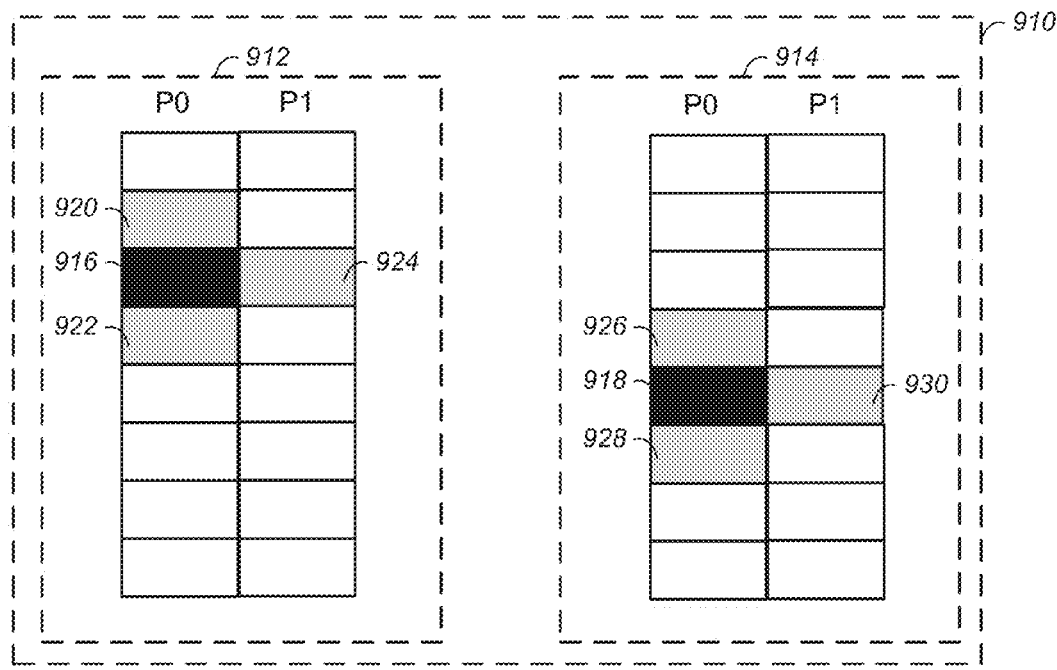
FIG. 9 illustrates identification of sub-prime blocks from their proximity to bad blocks.

FIG. 9 shows an example of a memory system 910 that includes two dies 912, 914, each containing a bad block, 916, 918 respectively. Blocks that are located adjacent to bad blocks 916, 918, are designated as sub-prime blocks based on their proximity to the bad blocks. Bad block 916 is located in plane 0 ("P0") of a first die 912. Neighboring blocks 920, 922, on either side of bad block 916 in plane 0 are identified as sub-prime because they are immediately adjacent to bad block 916. In other examples, two or more blocks on either side in the same plane may be designated as sub-prime. In addition, block 924 in plane 1 is designated as a sub-prime block because of its proximity to bad block 916. In other examples, blocks that are diagonally adjacent to a bad block may also be designated as sub-prime blocks. In yet other examples, designation of sub-prime blocks may be limited to the same plane as the bad block (i.e. a bad block in plane 0 only generates sub-prime blocks in plane 0 and block 924 would not be designated as a sub-prime block because it is in plane 1). The physical layout and operating conditions generally determine the zone around a bad block in which blocks are designated sub-prime. This sub-prime zone may be modified according to observed block failure over time so that sub-prime block designation accurately reflects failure rates.

Bad block 918 in die 914 results in similar designation of adjacent blocks 926, 928, 930, as sub-prime blocks. Such designation is limited to the same die as the bad block because blocks of different dies are unlikely to be affected by the same defect. In other examples, sub-prime zones may extend between dies.

While the above description refers to "prime" blocks and "sub-prime" blocks, it will be understood that operational ("good") blocks (blocks that are not bad and are used for storage of data) may be categorized into any number of categories. In general, prime blocks are any blocks that are not either bad or sub-prime. Prime blocks may be available for unrestricted use while sub-prime blocks are available for some limited or modified use.

Linking of Sub-Prime Blocks

Sub-prime blocks that are identified as described above, or otherwise, may be operated in a manner that is different to the manner in which prime blocks are operated. In general, knowing that such blocks are likely to cause more errors, and are likely to wear faster than prime blocks allows the memory system to adjust accordingly.

In many memory systems, blocks in different planes are linked together for parallel operation so that data may be programmed and read rapidly. A set of such linked blocks may be referred to as a "metablock." In memory systems that use metablocks, a metablock may be treated as the minimum unit of erase. Examples of metablocks are described in U.S. Pat. Nos. 7,433,993 and 8,504,798. In many cases, selection of blocks to be linked as metablocks follows a predetermined pattern. For example, block 0 from each plane may be selected to be operated as a first metablock, followed by block 1 from each plane as a second metablock, and so on. When a bad block is encountered the pattern omits the bad block and selects the next block in that plane. Thus, if block 1 in plane 1 is a bad block, then a metablock could be formed by block 1 of plane 0, block 2 of plane 1, and block 1 of any other planes. In such a scheme, blocks that are not bad are simply used in order by physical location.

According to an aspect of the present invention, metablocks are formed from blocks that are selected according to their categorization, for example, as prime or sub-prime blocks. Thus, instead of simply selecting the next available block from each plane to fatal a metablock, blocks are selected from the same category so that, for example, sub-prime blocks from different planes are linked together to form a metablock.

Figure 10:
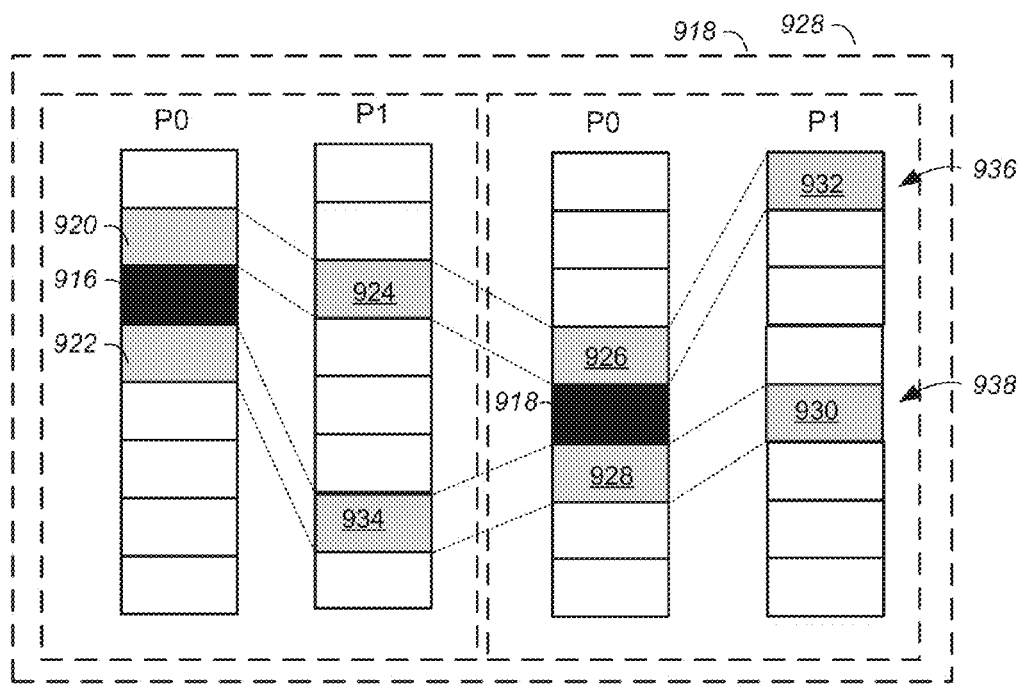
FIG. 10 illustrates linking sub-prime blocks into sub-prime metablocks.

FIG. 10 shows an example of a two-die arrangement, with two planes in each die as in FIG. 9. Blocks 916 and 918 in dies 912, 914 respectively are identified as bad blocks as before. Blocks 920, 922, 924, 926, 928, 930, are categorized as sub-prime blocks based on their proximity to bad blocks 916, 918. In addition, other blocks 932, 934, are also categorized as sub-prime blocks based, for example, on EPD testing, program characteristics, erase characteristics, ECC results, or for other reasons. Sub-prime blocks are linked together to form metablocks as shown. A first metablock 936 is formed from blocks 920, 924, 926, 932. A second metablock 938 is formed from blocks 922, 934, 928, 930. The eight sub-prime blocks form just two metablocks in this arrangement. If categorization is not used in assigning blocks to metablocks then sub-prime blocks may be distributed across a larger number of metablocks (as many as eight metablocks). In general, when even one block in a metablock fails, the metablock fails and is discarded (marked as bad and not subsequently used for data storage). By concentrating sub-prime blocks in a small number of metablocks as shown, the number of metablocks with a high risk of failure (containing sub-prime blocks) is reduced and the number of metablocks with a low risk of failure (containing only prime blocks) is increased accordingly. While the example shown has metablocks that are exclusively formed of sub-prime blocks (sub-prime metablocks) and metablocks that are formed exclusively of prime blocks (prime metablocks) in some cases one or more metablock may be formed of a mix of prime and sub-prime blocks (e.g. where the number of sub-prime blocks is not the same in all planes). Such metablocks may be considered sub-prime metablocks and may be operated accordingly, or may considered hybrid metablocks and may be operated according to a hybrid operating scheme. It is not necessary to form metablocks exclusively from one category of block in order to benefit from categorization.

In general, in systems in which metablocks are formed of blocks from different planes, such a metablock is then operated as the minimum unit of erase (i.e. as a block). Such metablocks may be considered as large blocks that extend across multiple planes. Data management structures are generally configured to reflect the large block structure of such an arrangement. In general, techniques that can be applied to an individual block in a single plane may also be applied to such large blocks, or metablocks, across multiple planes. Aspects of the present invention are applicable to both single-plane blocks and multi-plane blocks.

Operation of Sub-Prime Blocks

Sub-prime blocks may be configured for limited use (i.e. excluded from certain uses that prime blocks are available for). For example, certain critical data may be exclusively stored in prime blocks and a data management system may prohibit storing such critical data in sub-prime blocks. Examples of such data may include data that is used for data management such as File Allocation Table (FAT) data, directory data, and logical-to-physical address translation data. A memory controller may assign physical addresses for such data so that the data is limited to physical addresses that are located in prime blocks.

In another example, sub-prime blocks are restricted to storing particular data, for example data that can be retrieved from elsewhere if it is lost. For example, in some memory systems, a memory controller may use a portion of nonvolatile memory when performing internal copy operations. Such data can be retrieved from the original data if the copy in sub-prime blocks becomes uncorrectable.

In some examples, a host may identify particular data as critical data, or high priority data. While aspects of the present invention may be implemented without any host involvement, in some cases a host may be aware that memory categorization is implemented and may specify that particular data is to be stored in prime blocks only.

In some memory systems, physical blocks are configurable as either Single Level Cell (SLC) or Multi Level Cell (MLC) blocks. It may be desirable to limit sub-prime blocks to just one configuration (i.e. exclusively SLC or exclusively MLC) depending on the memory system. In general, MLC blocks are used for longer term storage for data that is not frequently updated. Thus, limiting sub-prime blocks to MLC operation may reduce the number of write-erase cycles experienced by such blocks, which tend to wear faster than prime blocks (i.e. tend to fail at lower write-erase cycle counts). In other cases, sub-prime blocks may be limited to SLC operation which generally provides wider threshold voltage distributions and lower error rates. Thus, a block that is found to have a large number of cells outside assigned threshold voltage ranges (between MLC logic states) during EPD testing may be categorized as sub-prime, and may be configured for SLC operation in which assigned threshold voltage distributions are wider.

In some memory systems, sub-prime blocks may be limited to store data that is subject to some additional safety measures that are not applied to data stored in prime blocks. For example, such data may be written in a sub-prime block while a copy remains elsewhere and may then be read from the sub-prime block and verified as correctly written before the copy is deleted. Such a scheme may be referred to as a post-write read scheme. Examples of post write read systems and methods are described in U.S. Patent Publications Numbers 20110096601; 20110099460; 20130028021; 20130031429; 20130031430; 20130031431; and in U.S. Pat. No. 8,214,700 which are hereby incorporated by reference in their entirety.

In another example, data stored in sub-prime blocks may be subject to a redundancy scheme that is not applied to prime blocks. While some redundancy data, for example, Error Correction Code (ECC) data may be generated for all stored data, some additional redundancy data may be generated for data stored in sub-prime blocks. This may involve more ECC data than used elsewhere in the memory system (i.e. a higher level of ECC protection). An additional scheme may be applied to sub-prime blocks such as an Exclusive OR (XOR) scheme that performs an XOR operation on two or more portions of data before they are stored. Such an XOR scheme allows recovery of any portion of data that is uncorrectable by ECC (UECC) by reversing the XOR operation. Such an XOR scheme may not be applied to prime blocks because ECC may be sufficient to correct the relatively small number of errors likely in prime blocks.

In some memory systems, the number of write-erase cycles ("hot count") is tracked on a block-by-block basis so that wear can be distributed evenly across all blocks, thus avoiding concentrating wear in particular blocks which may lead to premature failure of such blocks. Such a wear leveling scheme may be adapted to reduce wear on sub-prime blocks which may tend to fail after a smaller number of cycles than prime blocks.

According to an example, fixed values are added to hot counts of sub-prime blocks. For example, a sub-prime block may have an initial hot count of 500. Thus, a wear leveling scheme would direct new writes to prime blocks until hot counts of prime blocks reached 500 cycles.

According to another example, multipliers are applied to the actual hot counts of different blocks. Thus, while some blocks may have hot counts incremented by one for each write-erase cycle, other blocks may apply a multiplier X so that their hot count increases by X for each write-erase cycle. Sub-prime blocks may be assigned a multiplier that is greater than one. For example, all sub-prime blocks may be assigned a multiplier X=3 so that their hot counts are incremented by 3 for each write-erase cycle. Wear leveling would ensure that such a block experienced one third as much use as a prime block having its hot incremented by one per write-erase cycle.

Other schemes for managing sub-prime block usage may be implemented and techniques are not limited to applying a fixed offset, or a multiplier to a hot count. Knowledge of block-by-block life expectancy may allow a wide variety of schemes to manage block usage and avoid premature block failures. While examples above generally treat all sub-prime blocks similarly, sub-prime blocks may be further categorized and each sub-category may be differently treated. For example, blocks may be assigned to sub-categories that reflect how far their performance deviates from performance of a prime block. Sub-prime blocks that are near-prime may be subject to near-prime operation (e.g. prohibited from storing critical data but otherwise operated as prime blocks). Sub-prime blocks that are far from prime may be subject to more modified operation (e.g. XORing stored data, MLC or SLC only, increased hot counts, or some combination). Wear leveling schemes may be applied according to categorization of sub-prime blocks so that sub-prime blocks with worse test results receive higher initial hot counts or multipliers and sub-prime blocks with better test results receive lower initial hot counts or multipliers.

Figure 11:
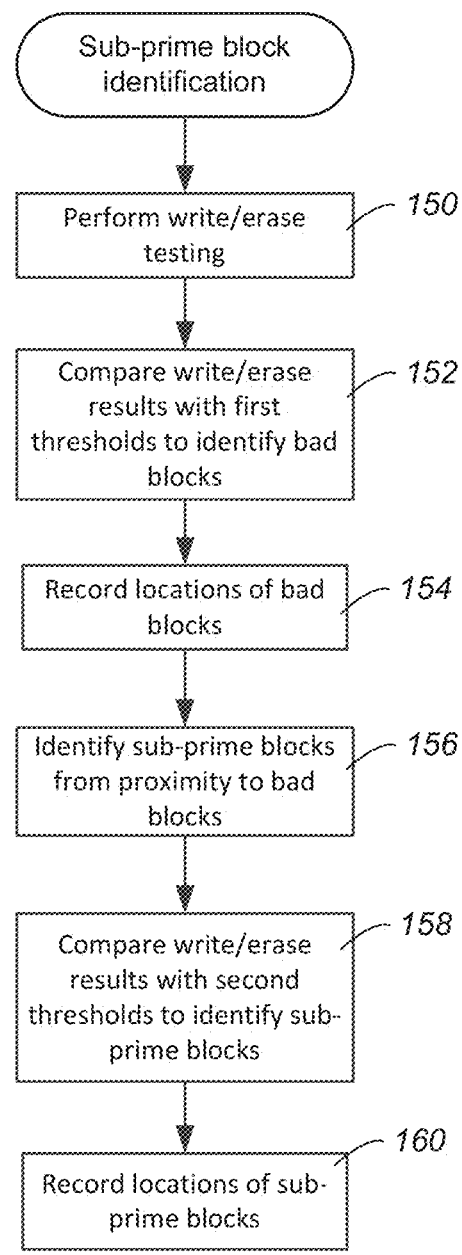
FIG. 11 shows how sub-prime blocks may be identified.

FIG. 11 illustrates an example of a method of identifying sub-prime blocks. Write/erase testing is performed on all blocks 150, for example, by programming a test pattern and subsequently erasing it while gathering testing data. This may be repeated. The results are then compared with first thresholds to identify bad blocks 152. For example, blocks that failed to program the test data within a threshold time, or failed to erase within a threshold time, may be considered bad blocks. The locations of the bad blocks are then recorded in a bad block list 154. Subsequently, sub-prime blocks are identified from their proximity to bad blocks 156. For example, blocks on either side of a bad block in the same plane as the bad block may be categorized as sub-prime blocks. The test data is then compared with second thresholds to identify sub-prime blocks (e.g. blocks that have slow program and/or erase, high EPD numbers, etc.) 158. The locations of sub-prime blocks are then recorded 160. This process may be carried out as part of product testing and locations of bad and sub-prime blocks may later be used when the product is configured for operation.

Figure 12:
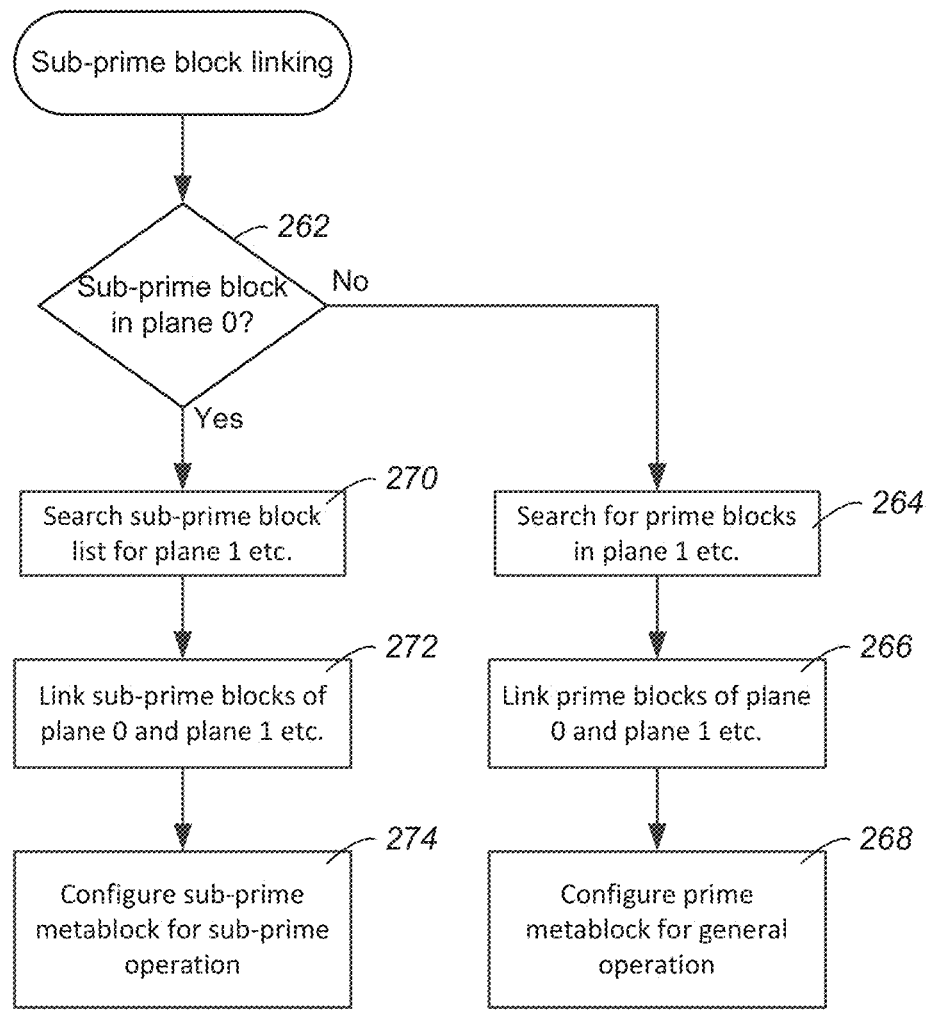
FIG. 12 shows how blocks may be linked into metablocks according to category.

FIG. 12 illustrates a scheme for forming metablocks using categorization information. A block is selected from plane 0 (may be selected based on location, e.g. next available block in sequential order) and a determination is made as to whether it is a sub-prime block 262. If it is not sub-prime, then it is a prime block and the system looks for another prime block in plane 1 and in any other planes 264. These prime blocks are then linked to form a prime metablock 266 which is configured for general operation 268. If the block in plane 0 is a sub-prime block then the system looks for a sub-prime block in plane 1 and in any other planes 270. These sub-prime blocks are then linked to form a sub-prime metablock 272 that is configured for sub-prime operation 274.

Figure 13:
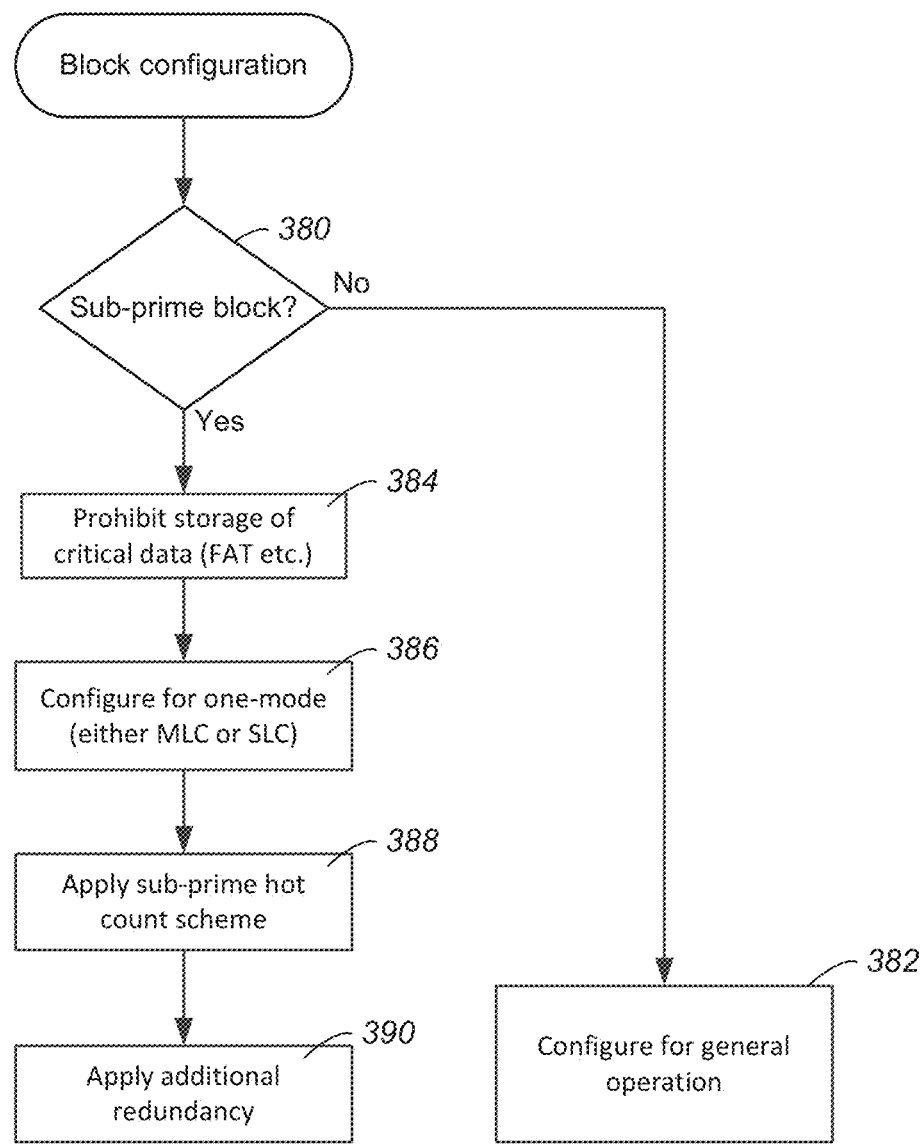
FIG. 13 shows how blocks may be configured according to category.

FIG. 13 illustrates an example of a scheme for configuring blocks. A determination is made as to whether a block is a sub-prime block 380. If it is not a sub-prime block then it is configured for general operation (unrestricted operation) 382. If the block is a sub-prime block then it is prohibited from storing critical, data such as FAT 384. It is also configured for one-mode operation (exclusively MLC or SLC) 386. It is subject to a modified hot count scheme that provides an increased hot count for a given number of actual write-erase cycles 388. An additional redundancy scheme is applied to the sub-prime block 390. While the scheme of FIG. 13 shows multiple steps applied to a sub-prime block, other schemes may apply only one, or only some subset of these steps to sub-prime blocks.

Figure 14:
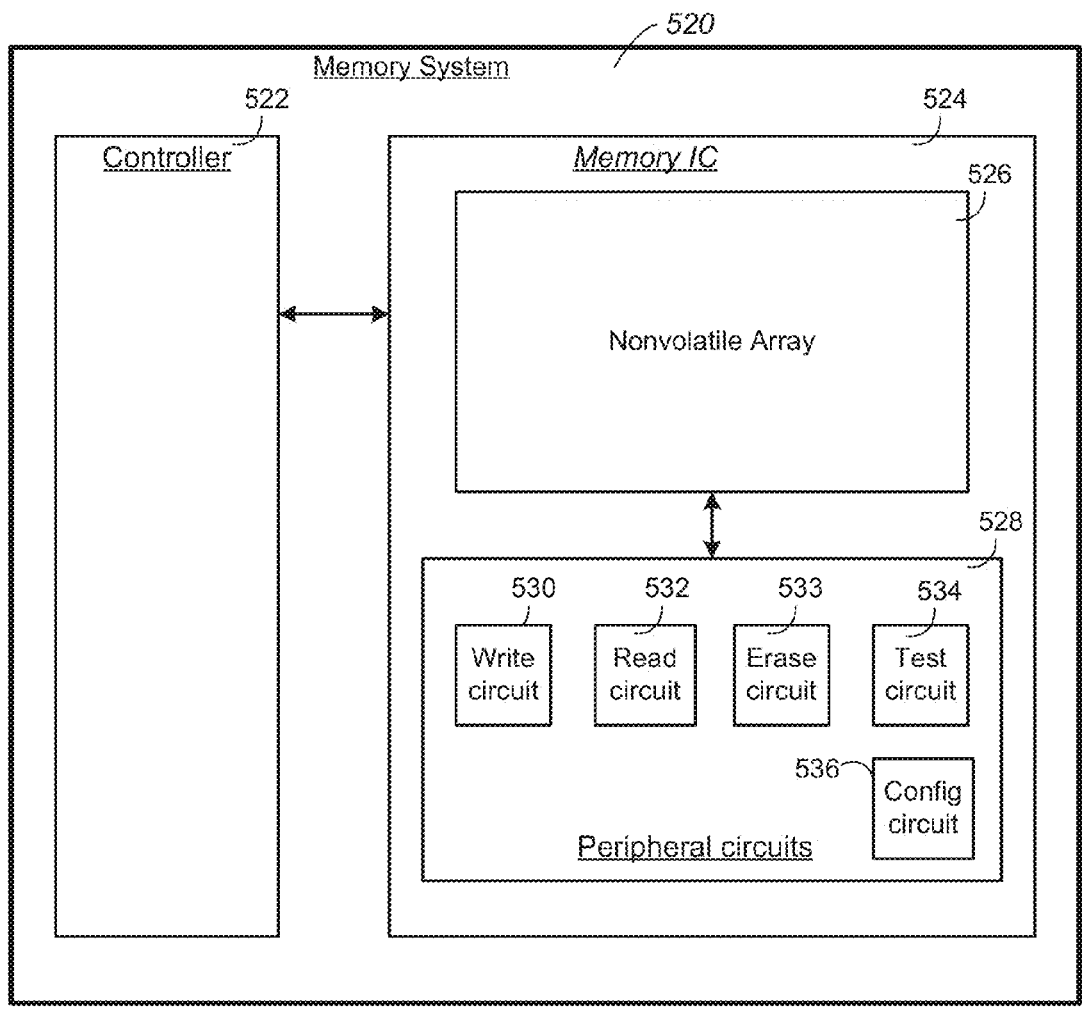
FIG. 14 shows an example of hardware that may be used to implement aspects of the present invention.

FIG. 14 shows an example of hardware that may be used to implement aspects of the present invention. A memory system 520 includes a memory controller 522 and a memory IC 524. The memory IC 524 includes a block-erasable nonvolatile memory array 526 (e.g. planar NAND array, 3-D memory, or other array) which includes both SLC and MLC blocks. The memory IC 524 also has peripheral circuits 528 including a write circuit 530, a read circuit 532, and an erase circuit 533 that are configured respectively write, read, and erase one or more test patterns of data in blocks of memory array 526. Test circuit 534 collects testing data during such operations and blocks are categorized according to the test results (e.g. as prime and sub-prime blocks). Peripheral circuits 528 also include a configuration circuit 536 that configures blocks according to their category so that, for example, sub-prime blocks may be limited to storing certain kinds of data, or may be configured to use redundancy schemes or wear leveling schemes that are not applied to prime blocks.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating blocks of a memory array comprising:
   categorizing the blocks into a plurality of categories including prime blocks, sub-prime blocks, and bad blocks;
   wherein the categorizing includes identifying a bad block from test results obtained from the bad block, and subsequently identifying sub-prime blocks based on their proximity to the bad block;
   subsequently selecting individual blocks in different planes for parallel operation in metablocks such that each block in a metablock is selected from the same category;
   configuring metablocks formed from prime blocks as prime metablocks that are operated in a first manner; and
   configuring metablocks formed from sub-prime blocks as sub-prime metablocks that are operated in a second manner that is different from the first manner.

2. The method of claim 1 wherein the categorizing includes:
   testing each of the blocks to obtain test results;
   subsequently, comparing test results for a block with first criteria to determine if the block is a bad block; and
   comparing the test results for the block with second criteria to determine if the block is a sub-prime block.

3. The method of claim 2 further comprising: categorizing blocks that are not determined to be bad blocks, and are not determined to be sub-prime blocks, as good blocks.

4. The method of claim 1 wherein the categorizing includes identifying bad blocks from testing, and identifying sub-prime blocks from proximity to bad blocks and from testing of sub-prime blocks.

5. The method of claim 1 wherein the metablocks formed from sub-prime blocks are limited to operation as MLC blocks and the metablocks formed from prime blocks are configured for operation as either SLC or MLC blocks.

6. The method of claim 1 wherein the metablocks formed from sub-prime blocks are limited to store certain types of data and the metablocks formed from prime blocks are used to store any data sent to the memory array.

7. The method of claim 1 wherein operation in the second manner includes assigning a write-erase cycle count to a sub-prime block that is greater than a number of write-erase cycles actually undergone by the sub-prime block.

8. A method of operating erase blocks of a memory array comprising:
- individually testing a plurality of erase blocks to determine a number of memory cells with threshold voltages that are between target threshold voltage ranges associated with logic states for each of the plurality of erase blocks;
- categorizing the plurality of erase blocks into a plurality of categories based on the number, the plurality of categories including prime erase blocks, and sub-prime erase blocks including categorizing erase blocks that are in close proximity to bad blocks as sub-prime blocks;
- operating prime erase blocks in a first manner;
- operating sub-prime erase blocks in a second manner that is different from the first manner; and
- wherein operation in the second manner is restricted to storing only data that is recoverable from other blocks in the memory array.

9. The method of claim 8 wherein the first manner includes operation in both MLC and SLC modes, and the second manner restricts sub-prime erase blocks to use in SLC mode.

10. The method of claim 8 wherein operation in the second manner is restricted to blocks used for internal copying of data.

11. The method of claim 8 wherein the data is recoverable from another copy of the data that is stored in another block in the memory array.

12. The method of claim 8 wherein the data is recoverable by performing an exclusive OR operation (XOR) on data stored in another block in the memory array.

13. The method of claim 8 categorizing the plurality of erase blocks into a plurality of categories includes categorizing erase blocks that are in close proximity to bad blocks as sub-prime blocks.

14. A method of operating erase blocks of a memory array comprising:
- individually testing a plurality of erase blocks to obtain block-specific test information;
- storing the block-specific test information;
- subsequently, categorizing the plurality of erase blocks into a plurality of categories based on the block-specific test information, the plurality of categories including prime erase blocks, and sub-prime erase blocks;
- identifying bad blocks and categorizing erase blocks that are in close proximity to bad blocks as sub-prime blocks;
- configuring prime erase blocks for general use in storing user data; and
- configuring sub-prime erase blocks for limited use.

15. The method of claim 14 wherein the testing includes determining a number of memory cells with threshold voltages that are between target threshold voltage ranges associated with logic states for each of the plurality of erase blocks.

16. The method of claim 14 wherein prime metablocks are configurable as either Single Level Cell (SLC) blocks or Multi Level Cell (MLC) blocks, and sub-prime erase blocks are configured exclusively as SLC blocks.

17. The method of claim 14 wherein prime metablocks are configurable as either Single Level Cell (SLC) blocks or Multi Level Cell (MLC) blocks, and sub-prime erase blocks are configured exclusively as SLC blocks.

18. The method of claim 14 wherein the sub-prime erase blocks are configured for use that is limited to storing data that is already stored in another block in the memory array, or can be reproduced from data stored in another block in the memory array.

* * * * *